United States Patent [19]

Di Tria

[11] 4,370,725

[45] Jan. 25, 1983

[54] METHOD OF AND CIRCUIT ARRANGEMENT FOR AUTOMATIC SIGNAL-LEVEL CONTROL

[75] Inventor: Paolo Di Tria, Turin, Italy

[73] Assignee: CSELT - Centro Studi e Laboratori Telecomunicazioni S.p.A., Turin, Italy

[21] Appl. No.: 188,036

[22] Filed: Sep. 17, 1980

[30] Foreign Application Priority Data

Sep. 18, 1979 [IT] Italy ............................... 68828 A/79

[51] Int. Cl.³ ............................................. H04L 15/24
[52] U.S. Cl. ................................... 364/582; 364/514; 330/51; 358/174
[58] Field of Search .................. 364/582, 514; 375/76, 375/98; 358/174; 330/278, 51

[56] References Cited

U.S. PATENT DOCUMENTS

| | | | |
|---|---|---|---|
| 3,624,562 | 11/1971 | Fujimura | 364/514 X |
| 3,715,666 | 2/1973 | Mueller | 364/514 X |
| 3,745,463 | 7/1973 | Klein | 364/514 X |
| 3,921,072 | 11/1975 | Sato | 364/514 X |
| 3,983,381 | 9/1976 | Jones, Jr. | 364/514 |
| 4,029,904 | 6/1977 | Papeschi | 375/76 |
| 4,186,384 | 1/1980 | Acker | 375/76 X |
| 4,191,995 | 3/1980 | Farrow | 364/157 |
| 4,213,097 | 7/1980 | Chiu et al. | 330/51 |

FOREIGN PATENT DOCUMENTS

980804  4/1973  Italy .

OTHER PUBLICATIONS

Article by Jacob Millman and Christos C. Halkias, titled "Integrated Electronics: Analog and Digital Circuits and Systems", McGraw-Hill Kogakusha, Ltd., Tokyo, copyright 1972, pp. 97, 98.
Article by Dennis R. Morgan, titled "On Discrete-Time AGC Amplifiers", IEEE Transactions on Circuits and Systems, vol. CAS-22, No. 2, Feb. 1972, pp. 135-145.
Article by Winfried Niebler and Wolfgang Hess, titled "Multiplizierer steuert Verstärkung", Radio Mentor Electronic, Aug. 1972, pp. 370-373.

Primary Examiner—Edward J. Wise
Attorney, Agent, or Firm—Karl F. Ross

[57] ABSTRACT

A binary input signal S multiplied by a level-controlling modifier $X_{n-1}$ is periodically sampled to determine its amplitude whose value is then differentially combined with a fixed reference value R to produce an error signal. The latter is multiplied by the same modifier $X_{n-1}$ and by a fractional coefficient k to yield a corrective value which is then algebraically combined with modifier $X_{n-1}$ to produce an updated modifier $X_n$ for the next sampling cycle. To avoid instability, the modified input signal may be subjected to a limitation of its dynamic range before or after sampling. A load to be driven by the input signals may receive the modified signal itself or the modifier used to control its level.

8 Claims, 1 Drawing Figure

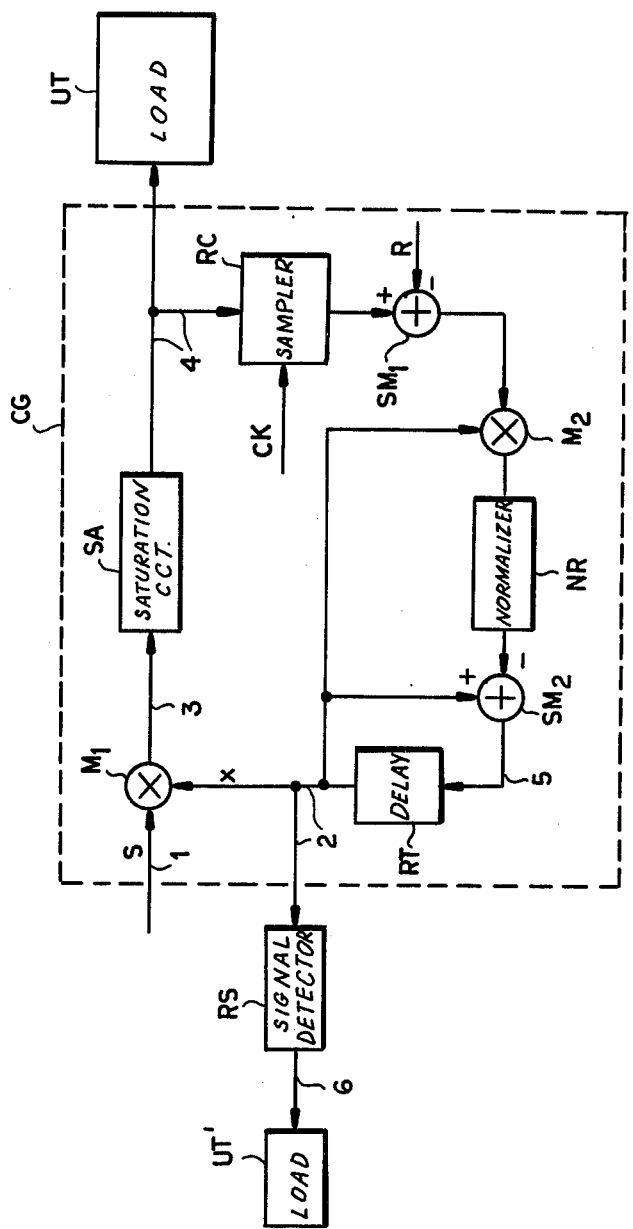

METHOD OF AND CIRCUIT ARRANGEMENT FOR AUTOMATIC SIGNAL-LEVEL CONTROL

FIELD OF THE INVENTION

My present invention relates to a method of controlling the level of an incoming signal as well as to a circuit arrangement for implementing that method.

BACKGROUND OF THE INVENTION

In telecommunication equipment designed to receive incoming signals, especially those of the binary type, it is frequently desirable to stabilize the signal level at a predetermined value. Thus, an incoming signal of magnitude S should be multiplied by a level-controlling modifier $X_o = R/S$ where R is a fixed reference value representing the desired signal amplitude. A direct establishment of modifier $X_o$, however, is difficult since it would require continuous division of the fixed reference level R by the variable magnitude S.

Theoretically, the variable modifier $X_o$ could also be determined through successive approximations by the use of an iterative algorithm such as one designed to minimize the squared error $(X - X_o)^2$ where X is an instant value approaching $X_o$. The value $X_n$ of parameter X at an instant $t_n$ can be derived from an earlier value $X_{n-1}$ (obtained at a preceding instant) from the relationship $$X_n = X_{n-1} - \beta \Delta \qquad (1)$$

where $\beta$ is a fractional constant designed to insure a stable feedback while $\Delta$ is the gradient of the squared error, being thus given by $2(X - X_o)$. Thus, equation (1) can be rewritten as follows:

$$X_n = X_{n-1} - 2\beta/S \cdot (S \cdot X_{n-1} - R) \qquad (2)$$

with $X_{n-1}$ substituted for X in the foregoing expression for $\Delta$. This gradient algorithm has the advantages of simplicity and speed of convergence; however, the need for division by the variable signal level S would again create considerable circuital problems.

A prior solution to this problem resides in the provision of a read-only memory (see, for example, Italian Pat. No. 980,804) storing different values for the quotient R/S in as many cells addressable by the incoming signal. Evidently, such a memory must have a large storage capacity if a substantial number of signal levels are to be accommodated.

OBJECTS OF THE INVENTION

An object of my present invention, therefore, is to provide a relatively simple method of electronically implementing the aforedescribed gradient algorithm without the need for division by the magnitude of a varible signal level.

A related object is to provide relatively inexpensive circuitry for putting that method into practice.

SUMMARY OF THE INVENTION

I have found, in conformity with my present invention, that the problem of circuital implementation can be solved by replacing S in the denominator of the second term of equation (2) with $R/X_{n-1}$ as a close enough approximation thereof. Equation (2) then becomes $$X_n = X_{n-1} - kX_{n-1} \cdot (S \cdot X_{n-1} - R) \qquad (3)$$

where k is a fractional coefficient equal to $2\beta/R$.

Thus, the method according to my present invention comprises the steps of (a) multiplying the incoming signal S by a level-controlling modifier $X_{n-1}$, (b) differentially combining the thus-modified signal magnitude $S \cdot X_{n-1}$ with the fixed reference value R to produce an error signal equal to $\pm(S \cdot X_{n-1} - R)$, (c) multiplying the error signal with modifier $X_{n-1}$ and with the fractional coefficient k to produce a corrective value $\pm k \cdot X_{n-1} \cdot (S \cdot X_{n-1} - R)$, (d) algebraically combining this modifier with the corrective value to produce an updated modifier $X_n$ conforming to equation (3), and (e) repeating steps (a) through (d) with the updated modifier $X_n$. When the error signal disappears, i.e. when the product $S \cdot X_{n-1}$ becomes equal to R, the corrective term will be zero so that $X_n = X_{n-1}$. With periodic sampling of the incoming signal at a time when its level remains substantially constant, this result is generally attained after only a few sampling cycles. The updated modifier $X_n$ produced in step (d) may be delayed by substantially a sampling period before being used to multiply another sample of the incoming signal S in a repeat of step (a).

A circuit arrangement designed to carry out the method outlined above includes first multiplier means with inputs connected to one lead carrying the incoming signal S and to another lead carrying the modification signal $X_{n-1}$, a first adder with inputs respectively connected to receive the modified signal amplitude $S \cdot X_{n-1}$ from a further lead together with the fixed reference signal R, second multiplier means with inputs connected to the first adder and to the aforementioned other lead for producing the corrective signal $\pm k(S \cdot X_{n-1} - R)$, a second adder with inputs respectively connected to the second multiplier means and to that other lead for producing the updated modification signal $X_n$, delay means connecting the output of the second adder to the aforementioned other lead for supplying same with the signal $X_n$ after a certain lag enabling interative feedback to the second multiplier and adder, and signal-receiving means connected to one of the two last-mentioned leads for receiving either the modified signal $S \cdot X_{n-1}$ or the modifier $X_{n-1}$ as an indication of the presence or absence of signal S.

When the incoming signal is absent, i.e. with $S = 0$, equation (3) would yield a corrective value equal to $kR \cdot X_{n-1}$ resulting in an unstable operation with modifier X progressively incremented. Instability would also be caused with large values of $X_{n-1}$ which could cancel out $X_n$ or invert its sign. I therefore prefer to set an upper and a lower limit for the dynamic range of the modified signal magnitude $S \cdot X_{n-1}$; a suitable range limiter could be designed as a saturation circuit inserted either upstream or downstream (preferably the former) of a sampler between the first multiplier means and the further lead carrying the modified signal amplitude $S \cdot X_{n-1}$ to the first adder.

BRIEF DESCRIPTION OF THE DRAWING

The above and other features of my invention will now be described in detail with reference to the accompanying drawing the sole FIGURE of which diagrammatically illustrates a circuit arrangement for the control of a signal level in accordance with my present improvement.

SPECIFIC DESCRIPTION

In the drawing I have shown a lead 1 carrying an incoming signal S to one input of a multiplier $M_1$ forming part of a level-control assembly CG, the multiplier having another input connected to a lead 2 carrying a modification signal X which at a given instant $t_n$ has a value $X_{n-1}$ generated at a preceding instant $t_{n-1}$. Multiplier $M_1$ has an output lead 3 extending to a saturation circuit SA which establishes a lower and an upper limit for the dynamic range of the product $S \cdot X_{n-1}$, thus simulating a minimum value $S_{min}$ and a maximum value $S_{max}$ for signal S with signal X varying between a high value $R/S_{min}$ and a low value $R/S_{max}$. Circuit SA may comprise, for example, a two-stage amplifier whose inverting first stage saturates at an upper range limit while its second stage generates a predetermined maximum output voltage; at and below the lower range limit the first stage is cut off while the second stage generates a predetermined minimum output voltage of finite magnitude. The two limiting output voltages are so chosen that the corrective term $k \cdot X_{n-1}(S \cdot X_{n-1} - R)$ has an absolute value progressively converging toward zero throughout the operating range.

Saturating circuit SA has an output lead 4 shown connected, on the one hand, to a load UT (e.g. a modem or a decoder) and, on the other hand, to a sampler RC driven by a train of periodic pulses CK from a nonillustrated clock. Sampler RC may be a simple gate but could also include an envelope detector of the linear or the RMS type operating on an incoming carrier wave.

A first adder $SM_1$ receives on one input (+) the output pulses of sampler RC, occurring at successive instants $t_1, t_2 \ldots t_{n-1}, t_n, t_{n+1}$ etc., and on another input (−) a d-c potential representing the fixed reference value R. The resulting error signal $S \cdot X_{n-1} - R$ is delivered to one input of a second multiplier $M_2$ whose other input is connected to lead 2 for receiving therefrom the modification signal X which at the instant $t_n$ here considered has the value $X_{n-1}$. The product $X_{n-1} \cdot (S \cdot X_{n-1} - R)$ is transmitted to a normalizer NR for further multiplication by the fractional constant $k = 2\beta/R$; the resulting corrective signal is then fed to one input (−) of a second adder $SM_2$ for algebraic combination with signal $X_{n-1}$ from lead 2 to which another input (+) of that adder is connected. Thus, there appears on an output lead 5 of adder $SM_2$ the updated modification signal $X_n$ delivered to lead 2 via a delay line RT which introduces a lag substantially equal to a sampling cycle corresponding to a period of clock pulses CK. Adder $SM_2$ and delay line RT could be replaced by an integrating operational amplifier with a time constant on the order of a clock-pulse period. Normalizer NR and multiplier $M_2$ could also be combined into a single unit.

The positive and negative signs on the inputs of both adders $S_2$ and $SM_2$ could be interchanged without altering the result.

Lead 2 is shown further connected to a signal detector RS with an output lead 6 feeding the modification signal X to another load UT' which may be similar to load UT and may in fact replace same. With incoming signal S=0 and the voltage on lead 4 simulating the chosen minimum value $S_{min}$, signal X is high; when signal S has an actual magnitude well above this simulated minimum, signal X will lie below the threshold of detector RS so that lead 6 will carry zero voltage. Thus, load UT' receives the complement of the level-controlled binary signal SX fed to load UT via lead 4.

I claim:

1. A method of controlling the level of an incoming signal, comprising the steps of:
    (a) multiplying the incoming signal by a level-controlling modifier;
    (b) differentially combining the thus-modified magnitude of said signal with a fixed reference value to produce an error signal;
    (c) multiplying said error signal with said modifier and with a fractional coefficient to produce a corrective value;
    (d) algebraically combining said modifier with said corrective value to produce an updated modifier; and
    (e) repeating steps (a) through (d) with the updated modifier up to substantial disappearance of said error signal.

2. A method as defined in claim 1, comprising the further step of setting an upper and a lower limit for the dynamic range of the modified magnitude of the incoming signal between steps (a) and (b).

3. A method as defined in claim 1 or 2 wherein the modified magnitude of the incoming signal is periodically sampled between steps (a) and (b).

4. A method as defined in claim 3 wherein the updated modifier produced in step (d) is delayed by substantially a sampling period before being used to multiply another sample of the incoming signal in a repeat of step (a).

5. A circuit arrangement for controlling the level of an incoming signal, comprising:
    first multiplier means with inputs connected to one lead carrying the incoming signal and to another lead carrying a level-controlling modification signal for producing a modified signal amplitude on a further lead;
    a first adder with inputs respectively connected to receive the modified signal amplitude from said further lead and a reference signal of fixed magnitude for differentially combining same to produce an error signal;
    second multiplier means with inputs connected to said first adder and to said other lead for producing a corrective signal as the product of said modification signal times said error signal times a fractional coefficient;
    a second adder with inputs respectively connected to said second multiplier means and to said other lead for algebraically combining said modification signal with said corrective signal to produce an updated modification signal;
    delay means connecting an output of said second adder to said other lead for delivering the updated modification signal thereto; and
    signal-receiving means connected to at least one of said other and further leads.

6. A circuit arrangement as defined in claim 5, further comprising saturation means between said first multiplier means and said further lead for setting an upper and a lower limit for the dynamic range of said modified signal amplitude.

7. A circuit arrangement as defined in claim 5 or 6, further comprising periodically operating sampling means inserted between said first multiplier means and said first adder for feeding said modified signal amplitude to the latter at discrete intervals.

8. A circuit arrangement as defined in claim 7 wherein said delay means introduces a lag substantially corresponding to an operating cycle of said sampling means.

* * * * *